(12) United States Patent
Powell

(10) Patent No.: US 7,043,148 B1
(45) Date of Patent: May 9, 2006

(54) WAFER HEATING USING EDGE-ON ILLUMINATION

(75) Inventor: Ronald A. Powell, San Carlos, CA (US)

(73) Assignee: Novellus Systems, San Jose, CA (US)

( * ) Notice: Subject to any disclaimer, the term of this patent is extended or adjusted under 35 U.S.C. 154(b) by 0 days.

(21) Appl. No.: 10/878,705

(22) Filed: Jun. 28, 2004

(51) Int. Cl.
*F26B 19/00* (2006.01)

(52) U.S. Cl. ............... 392/416; 392/418; 219/390; 219/405; 219/411; 118/724; 118/725; 118/50.1

(58) Field of Classification Search ........... 219/390, 219/405, 411; 392/416, 418; 118/724, 725, 118/50.1
See application file for complete search history.

(56) References Cited

U.S. PATENT DOCUMENTS

| | | | |
|---|---|---|---|
| 4,493,977 A * | 1/1985 | Arai et al. ............ | 219/411 |
| 6,034,356 A * | 3/2000 | Paranjpe ............ | 219/390 |
| 6,072,160 A | 6/2000 | Bahl | |
| 6,122,440 A | 9/2000 | Campbell | |
| 6,300,601 B1 * | 10/2001 | Suzuki ............ | 219/411 |

* cited by examiner

*Primary Examiner*—Shawntina Fuqua
(74) *Attorney, Agent, or Firm*—Delio & Peterson LLC; Peter W. Peterson

(57) ABSTRACT

A wafer, and a tungsten filament radiation heating source comprising at least one lamp arranged in a ring substantially surrounding the wafer edge. The radiation heating source irradiates the semiconductor wafer with radiation directed at the edge of the wafer, so that the radiation is adapted to penetrate the wafer edge and travel between the upper and lower surfaces into a central portion of the wafer sufficient to heat the wafer. The radiation-heating source may also have a reflector for reflecting radiation into the wafer edge, and at least one radiation and/or convection heating source mounted above or below the stage for directly heating one or both of the wafer upper and lower surfaces simultaneously with the radiation heating source surrounding the wafer.

20 Claims, 2 Drawing Sheets

WAFER HEATING USING EDGE-ON ILLUMINATION

BACKGROUND OF INVENTION

1. Field of the Invention

This invention relates generally to a method and apparatus for rapid thermal heating of a semiconductor wafer and, in particular, to a heating system which heats the wafer through its edge.

2. Description of Related Art

In processing semiconductor wafers used to manufacture integrated circuits (IC's) and other electronic devices, wafers are typically introduced into the processing tool at ambient temperature that is at or near room temperature. On the other hand, many process steps are carried out at elevated temperatures. Such processes include thermal oxidation or nitridation of surfaces, annealing of wafers to remove water vapor (i.e. degassing), chemical vapor deposition (CVD) of thin films, and the like. It is therefore often necessary to raise a wafer from a relatively low temperature to an elevated temperature. In order to keep wafer throughput high and cost-of-ownership low, the time to heat the wafer to its process temperature should be kept as short as possible. In addition, since reaction rates are often highly dependent on temperature (film deposition rate, water outgassing rate, and the like), it is also desired to achieve a uniform temperature across the wafer so that processing of the wafer is likewise uniform across its entire surface.

To address the need for rapid thermal processing (RTP), the IC industry has widely adopted radiant energy sources consisting of high-intensity lamps housed in the upper and/or lower surface of the processing chamber. Examples of such rapid thermal processing systems are those shown in U.S. Pat. Nos. 6,072,160 and 6,122,440. In these and other similar rapid thermal processing systems, zone-based radiant heating is utilized through the use of multiple spot lamps, with each generally heating different areas of one or both of the wafer surfaces.

Such heating lamps often use as a light source a tungsten filament lamp in a quartz envelope, typically including a halogen gas to improve lifetime. Blackbody radiation emitted from the hot filament (typically at temperature 2000–3000° K) provides the illumination. These quartz-tungsten or quartz-halogen lamps are inexpensive and widely deployed to heat silicon wafers. The visible radiation from such lamps is strongly absorbed by the silicon, which has an optical absorption coefficient α greater than $10^4$-$cm^1$ for visible light (wavelength ~380–780 nm). However, most of the radiation produced by these hot filament, black body sources has energy in the near-infrared region. For example, ~70% of the radiation from a tungsten filament at 3000° K lies in the infrared. The energy of these infrared photons is less than the 1.1 eV bandgap of silicon, and as a result they pass through the silicon wafer (which typically has a thickness less than 0.1 cm) with little or no absorption when the wafer is at room temperature (absorption coefficient α less than 1 $cm^{-1}$). At elevated temperatures above about 400° C., where free carrier absorption by electrons is strong in silicon, the thin wafer strongly absorbs both visible and near infrared radiation. Therefore, once the wafer gets hot enough, there is strong optical coupling to the wafer and rapid heating with tungsten-filament lamps becomes far more effective. However, the problem remains how to rapidly heat a silicon wafer with a conventional quartz halogen lamp when the wafer is initially at or near room temperature. In addition, the IC industry continues to drive process temperatures lower such that many processes are now carried out close to or below the temperature where strong optical coupling can be exploited for rapid heating with quartz-halogen lamps.

The lamp heating of wafers is typically done with broad area illumination from the wafer front and/or back side, in which the planar surfaces of the wafer are exposed to the light. While the area of illumination is large, for example, 720 $cm^2$ for a 300 mm diameter wafer, the wafer thickness is very small, for example, 0.075 cm. This thickness is much less than the absorption depth z of the radiation at room temperature ($z=1/\alpha>1$ cm) and, as a result, the percentage of incident light absorbed is very small.

SUMMARY OF INVENTION

Bearing in mind the problems and deficiencies of the prior art, it is therefore an object of the present invention to provide an improved method and apparatus for heating a semiconductor wafer in a semiconductor processing chamber.

It is a further object of the present invention to provide a method and apparatus for rapidly heating a silicon wafer with a conventional quartz-halogen lamp when the wafer is initially at or near room temperature.

It is another object of the present invention to provide an improved rapid thermal processing system that provides for more uniform heating across the entire wafer.

Another object of the present invention is to provide a method and apparatus for rapidly heating a silicon wafer with increased power density.

Still other objects and advantages of the invention will in part be obvious and will in part be apparent from the specification.

The above and other objects, which will be apparent to those skilled in art, are achieved in the present invention which is directed to a method of heating a semiconductor wafer comprising providing a semiconductor wafer having upper and lower surfaces, and an edge along a periphery of the wafer, and irradiating the semiconductor wafer with radiation directed at the edge of the wafer. The radiation penetrates the wafer edge and travels between the upper and lower surfaces into a central portion of the wafer sufficient to heat the wafer.

Typically, the wafer comprises silicon, has a diameter significantly greater than its thickness, usually more than 100 times the thickness, and has a thickness less than the absorption depth of a portion of the radiation in the wafer at room temperature. The irradiation may be from a tungsten filament, so that the radiation has a wavelength range of about 0.4–5 μm.

Preferably, the wafer is circular, and the irradiation is performed by at least one lamp arranged in a ring surrounding the wafer edge. The radiation is reflected between the upper and lower surfaces of the wafer into the central portion. The irradiation may also be performed by one or more lamps arranged in a ring surrounding the wafer, with the lamps directly irradiating the wafer edge. The lamps may further have a reflector for reflecting radiation into the wafer edge. The method may further include simultaneously directly heating one or both of the wafer upper and lower surfaces by radiation and/or convection heating.

In another aspect, the present invention is directed to an apparatus for heating a semiconductor wafer comprising a stage for securing a semiconductor wafer having upper and lower surfaces, and an edge along a periphery of the wafer, the stage adapted to exposing the wafer edge, and a radiation heating source substantially surrounding a wafer mounted in the stage. The radiation heating source irradiates the semiconductor wafer with radiation directed at the edge of the wafer, so that the radiation is adapted to penetrate the wafer edge and travel between the upper and lower surfaces into a central portion of the wafer sufficient to heat the wafer.

The apparatus radiation-heating source may comprise a lamp having a tungsten filament, and the radiation may have a wavelength range of about 0.4–5 μm. The radiation-heating source is adapted to reflect radiation between the upper and lower surfaces of the wafer into the central portion. Preferably, the stage is adapted to secure a circular wafer, and the radiation heating source comprises at least one lamp arranged in a ring surrounding the wafer edge. The radiation-heating source may also comprise one or more lamps arranged in a ring surrounding the wafer, with the lamps directly irradiating the wafer edge, and the radiation-heating source may also have a reflector for reflecting radiation into the wafer edge.

The apparatus may further include at least one radiation and/or convection heating source mounted above or below the stage for directly heating one or both of the wafer upper and lower surfaces simultaneously with the radiation heating source surrounding the wafer.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1–4 of the drawings in which like numerals refer to like features of the invention.

Figure 1:
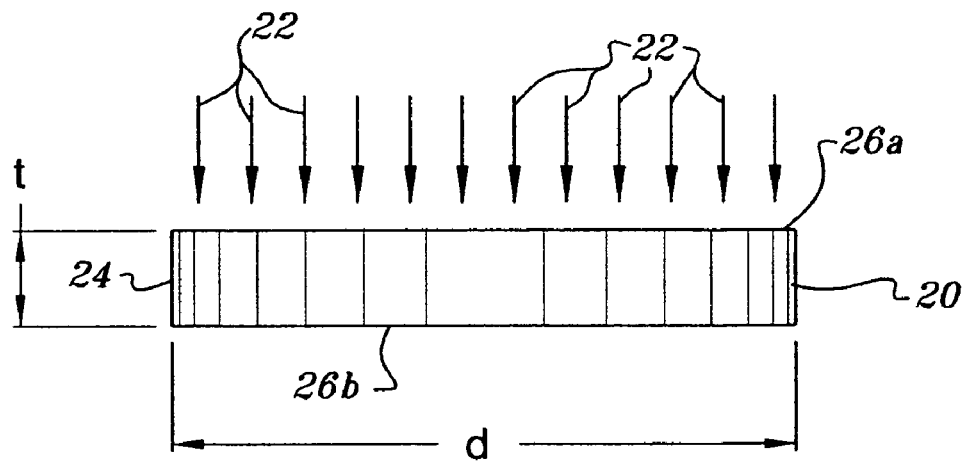
FIG. 1 is a side elevational view showing a conventional surface heating of a silicon wafer where, for simplicity, only top surface lamp irradiation is shown.
Figure 2:
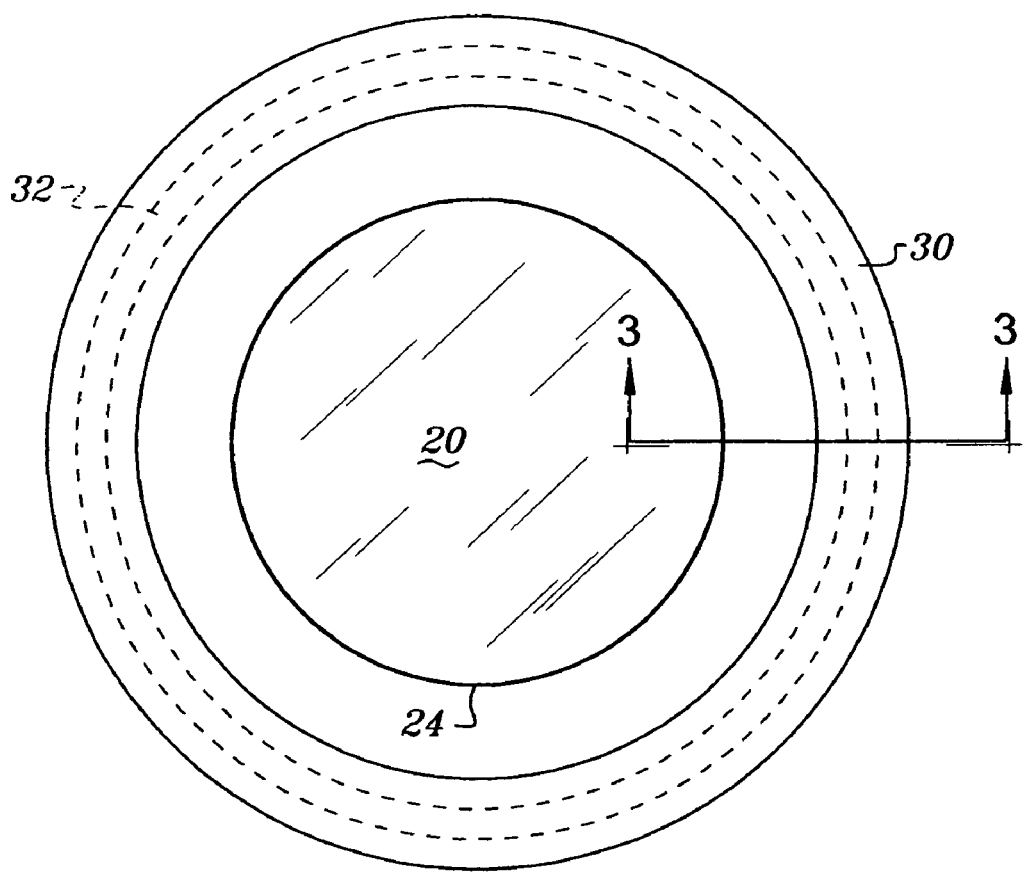
FIG. 2 is a top plan view of a preferred apparatus for heating the wafer with radiation directed at its edge.

As shown in FIG. 1, circular wafer 20 of diameter d and thickness t has surfaces 26a and 26b on the top and bottom, respectively (also know as front and backside, respectively). Prior art systems heat the wafer by directing radiant heat directly at the top or bottom surface of the wafer. Instead of utilizing radiation directed at the wafer's surface, the present invention instead directs the radiation at the wafer's edge. As shown in FIG. 2, lamp apparatus 30 has a ring-like design that extends completely around periphery 24 of wafer 20 and is disposed in essentially the same plane as the wafer. Lamp 32 may be a single or continuous lamp, as shown, or may be a series of shorter lamp segments that make up an essentially continuous ring around wafer 20. For a 300 mm diameter wafer, lamp 32 is typically 5–50 mm from wafer edge 24, although an optional lens or mirror assembly used to focus the lamp illumination onto the wafer edge may require or allow the use of larger wafer-to-lamp distances. The useful radiation produced by the preferred quartz-tungsten or quartz-halogen lamps has a wavelength range of about 0.4–5 μm, covering the visible and near-infrared emission spectrum from the tungsten filament up to the cutoff wavelength of the quartz lamp envelope.

Figure 3:
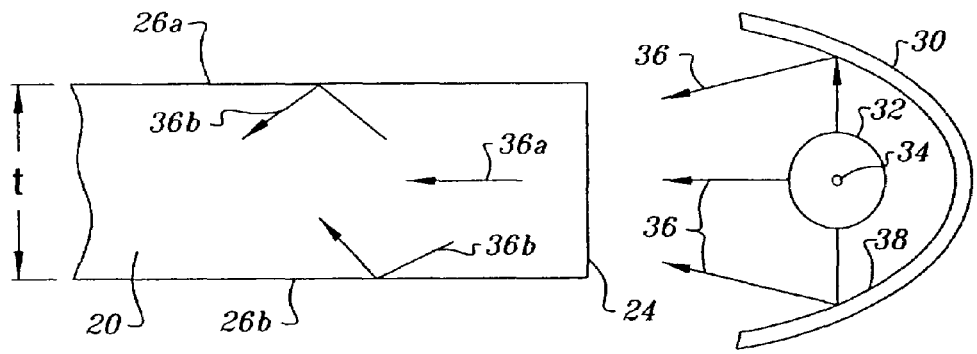
FIG. 3 is a cross-sectional side elevational view of a portion of the wafer and apparatus of FIG. 2, along line 3—3.

FIG. 3 depicts lamp apparatus 30 as comprising a parabolic or elliptical reflective surface 38 in which is mounted a quartz-halogen lamp 32 having a tungsten filament 34. The center of lamp 32 is preferably mounted within the planes defined by wafer top surface 25a and bottom surface 26b to give a direct edge-on illumination of wafer edge 24. The reflective surface 38 of lamp apparatus 30 permits both reflected and direct radiation 36 from lamp 32 toward wafer edge 24. By illuminating the wafer at its edge instead of normal to its planar surface, the effective absorption length of a large diameter silicon wafer is increased by a factor of 400 times (i.e., 300 mm diameter/0.75 mm thickness=400), since its thickness is now effectively its 300 mm diameter.

Radiation from the lamp is across a spectrum ranging from strongly absorbed visible to weakly absorbed infrared. Typical wafer thickness of 1 mm or less is less than the absorption depth of the weakly absorbed infrared portion of the radiation. To quantify the benefit of using edge-on illumination for weakly absorbed radiation, following Beer's Law, the radiant power absorbed in the silicon wafer after traveling a distance z from the irradiated surface is proportional to the factor $F=1-\exp(-\alpha z)$. Assuming $\alpha=1$ cm$^{-1}$=0.1 mm$^{-1}$ for weak absorption, the normal illumination for a distance z of 0.75 mm through the wafer thickness gives F=0.07, while edge-on illumination of a 300 mm wafer in accordance with the present invention, where z=300 mm, gives a factor F=1.00, which translates into 14 times greater absorption.

While absorption is exponential in general, for weak absorption where $\alpha z \ll 1$, one can approximate $F=1-\exp(-\alpha z) \sim \alpha z$. Therefore, the light intensity is linearly attenuated with depth into the wafer. One might therefore expect that the edge will be heated much more strongly than the center. However, in the present invention, the radial geometry of the ring shaped lamp irradiation produces a light intensity per unit cross-sectional area in the silicon that, in the absence of any absorption, increases linearly with decreasing distance from the wafer center. This geometric convergence of the illumination offsets the linear decrease in intensity due to weak absorption. The net result is improved center to edge thermal uniformity, even though the wafer is irradiated from the edge.

Another benefit of edge-on illumination in accordance with the present invention stems from the optical properties of silicon. The index of refraction n of silicon is approximately equal to 3.6 at 1 μm, and is greater than that of both air (n=1) and typical dielectric films (n≅1.5–2.0). As a result, the light radiation 36 that enters the silicon wafer through edge 24 will include both collimated beams 36a as well as internally reflective beams 36b reflected from the top and bottom silicon wafer surface boundaries, 26a and 26b, respectively (see FIG. 3). The silicon in effect behaves as a planar light pipe serving to confine incident light rays that are not strictly normal to the edge and might otherwise be expected to escape through the top or bottom surfaces. This effect increases the effective penetration depth of the light radiation and reduces the need to strongly collimate the light. Furthermore, since the edge and bevel of a silicon wafer are often intentionally left free of metal depositions due to concerns about articles or metal contamination during handling, reflective losses from metal on the edge should not be excessive.

While the method of the present invention is capable of heating a wafer from room temperature more rapidly than conventional top and bottom side illumination used in the prior art, the method also provides comparable heating rates to front side illumination, but with much lower lamp power. For example, 900 watts of front side lamp radiation would provide comparable rates of temperature rise to 60 watts of edge-on illumination in accordance with the present invention, given the latter's approximately 15 times improvement in absorbed optical power compared to direct top and bottom side illumination. It should be noted that while the power is lower, the power density of the edge-on irradiation will be greater since the illuminated wafer area is only the area of the edge $(2\pi r)(t)$ which is a factor of 2 t/r, or 70 times smaller, than the area of the top and bottom surface $(\pi r^2)$ used in the prior art. For example, incident power density for a 900 watt top bottom side irradiation of a 200 mm wafer is about 3 watts/cm$^2$, while the power density for a 60 watt ring type lamp in accordance with the present invention focused on the wafer edge is about 14 watts/cm$^2$.

Figure 4:
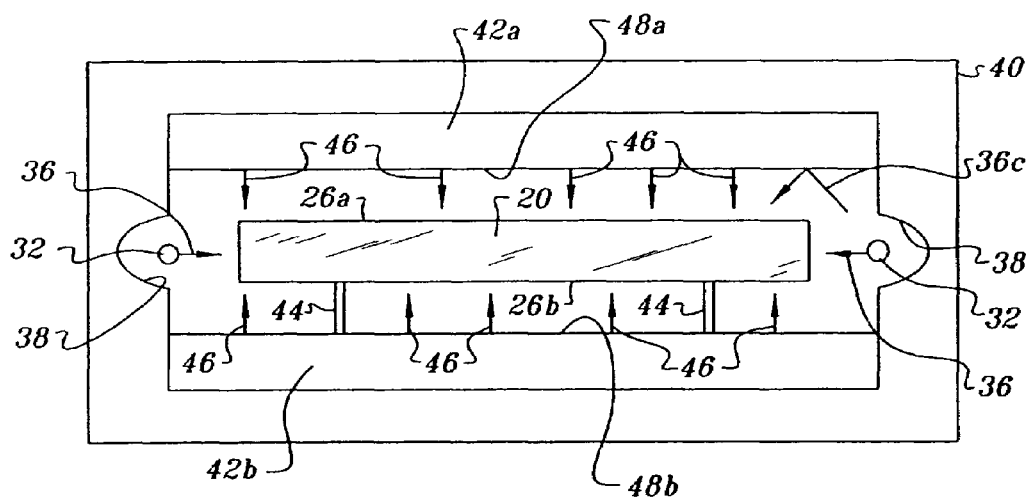
FIG. 4 is a cross-sectional side elevational view of another embodiment of the present invention.

Another embodiment of the apparatus and method of the present invention is depicted in FIG. 4. In addition to the ring type lamp 32, with reflective surface 38 focusing irradiation onto the wafer edge, apparatus housing 40 also includes spaced upper and lower hot plates 42a, 42b respectively. Wafer 20 may be secured on supports 44 extending above lower plate 48b. These hot plates 48a, 48b respectively heat the wafer top and bottom surfaces by a mixture of radiation 46 and convection, and provide for even faster heat up times. This hybrid implementation is possible in an edge-on irradiation approach since the top and bottom surfaces of the wafer are no longer encumbered by lamps and/or reflective fixtures as in conventional RTP systems.

Thus, the present invention to provide an improved method and apparatus for heating a semiconductor wafer in a semiconductor processing chamber, which develops for more uniform heating across the entire wafer with increased power density. It is able to rapidly heat a silicon wafer with a conventional quartz-halogen lamp, even when the wafer is initially at or near room temperature. While this invention addresses the problem of rapidly heating a sample with weakly absorbing radiation, there are other benefits to using edge-on illumination even if the wafer were not weakly absorbing, e.g. to free up space above or below the wafer for in-situ metrology.

While the present invention has been particularly described, in conjunction with a specific preferred embodiment, it is evident that many alternatives, modifications and variations will be apparent to those skilled in the art in light of the foregoing description. In addition, while the invention has been illustrated for quartz-halogen lamp heating of a silicon wafer, the method would apply with equal benefit to radiant heating sources having different spectral output (far infrared, RF, microwave, etc) and non-silicon substrates (GaAs, sapphire, etc) such that the radiation was weakly absorbed by the substrate—viz, $\alpha t<1$ where t is the substrate thickness and $\alpha$ is the absorption coefficient. It is therefore contemplated that the appended claims will embrace any such alternatives, modifications and variations as falling within the true scope and spirit of the present invention.

Thus, having described the invention, what is claimed is:

1. A method of heating a semiconductor wafer comprising:
providing a semiconductor wafer having upper and lower surfaces, and an edge along a periphery of the wafer between the upper and lower surfaces;
irradiating the semiconductor wafer solely with radiation directed at the edge of the wafer, wherein the radiation penetrates the wafer edge and travels between the upper and lower surfaces into a central portion of the wafer sufficient to heat the wafer.

2. The method of claim 1 wherein the wafer comprises silicon, and wherein the irradiation is from a tungsten filament.

3. The method of claim 1 wherein the wafer comprises silicon, and wherein the radiation has a wavelength range of about 0.4–5 µm.

4. The method of claim 1 wherein the wafer is circular and has a center, and wherein intensity of the radiation in the wafer increases with decreasing distance from the wafer center.

5. The method of claim 1 wherein the wafer has a thickness less than the absorption depth of the radiation in the wafer at room temperature.

6. The method of claim 1 wherein the wafer is circular, and wherein the irradiation is performed by at least one lamp arranged in a ring surrounding the wafer edge.

7. The method of claim 1 wherein the irradiation is performed by one or more lamps arranged in a ring surrounding the wafer, the lamps directly irradiating the wafer edge and further having a reflector for reflecting and focusing radiation into the wafer edge.

8. The method of claim 1 wherein the radiation is reflected between the upper and lower surfaces of the wafer into the central portion.

9. The method of claim 1 wherein the wafer has a diameter greater than 100 times the thickness.

10. The method of claim 1 further including simultaneously directly heating one or both of the wafer upper and lower surfaces by convection heating.

11. A method of heating a semiconductor wafer comprising:
providing a semiconductor wafer having upper and lower surfaces, and an edge along a periphery of the wafer between the upper and lower surfaces;
irradiating the semiconductor wafer with radiation focused onto the edge of the wafer, the radiation having a wavelength range of about 0.4–5 µm, wherein the radiation penetrates the wafer edge and travels between the upper and lower surfaces into a central portion of the wafer sufficient to heat the wafer.

12. The method of claim 11 wherein the wafer is circular and has a center, and wherein the irradiation is performed by at least one lamp arranged in a ring surrounding the wafer edge, such that intensity of the radiation in the wafer increases with decreasing distance from the wafer center.

13. The method of claim 11 wherein the wafer has a thickness less than the absorption depth of the radiation in the wafer at room temperature, and wherein the irradiation is performed by one or more lamps arranged in a ring surrounding the wafer, the lamps directly irradiating the wafer edge and further having a reflector for reflecting and focusing radiation into the wafer edge, such that the radiation is reflected between the upper and lower surfaces of the wafer into the central portion.

14. An apparatus for heating a semiconductor wafer comprising:
a stage for securing a semiconductor wafer having upper and lower surfaces, and an edge along a periphery of the wafer between the upper and lower surfaces, the stage adapted to expose the wafer edge;

a sole radiation heating source substantially surrounding a wafer mounted in the stage for irradiating the semiconductor wafer with radiation focused onto the edge of the wafer, wherein the radiation is adapted to penetrate the wafer edge and travel between the upper and lower surfaces into a central portion of the wafer sufficient to heat the wafer.

15. The apparatus of claim 14 wherein the radiation-heating source comprises a lamp having a tungsten filament.

16. The apparatus of claim 14 wherein the radiation has a wavelength range of about 0.4–5 µm.

17. The apparatus of claim 14 wherein the stage is adapted to secure a circular wafer, and wherein the radiation heating source comprises at least one lamp arranged in a ring surrounding the wafer edge.

18. The apparatus of claim 14 wherein the radiation-heating source comprises one or more lamps arranged in a ring surrounding the wafer, the lamps directly irradiating the wafer edge and further having a reflector for reflecting radiation into the wafer edge.

19. The apparatus of claim 14 wherein the radiation-heating source is adapted to reflect radiation between the upper and lower surfaces of the wafer into the central portion.

20. The apparatus of claim 14 further including at least one convection heating source mounted above or below the stage for directly heating one or both of the wafer upper and lower surfaces simultaneously with the radiation heating source surrounding the wafer.

* * * * *